United States Patent
Wang et al.

(10) Patent No.: US 11,646,548 B2
(45) Date of Patent: May 9, 2023

(54) MULTI-ACTIVE-REGION CASCADED SEMICONDUCTOR LASER

(71) Applicants: SUZHOU EVERBRIGHT PHOTONICS CO., LTD., Suzhou (CN); EVERBRIGHT INSTITUTE OF SEMICONDUCTOR PHOTONICS CO., LTD., Suzhou (CN)

(72) Inventors: Jun Wang, Suzhou (CN); Yao Xiao, Suzhou (CN); Shaoyang Tan, Suzhou (CN); Heng Liu, Suzhou (CN); Quanling Li, Suzhou (CN)

(73) Assignees: SUZHOU EVERBRIGHT PHOTONICS CO., LTD., Suzhou (CN); EVERBRIGHT INSTITUTE OF SEMICONDUCTOR PHOTONICS CO., LTD., Suzhou (CN)

(*) Notice: Subject to any disclaimer, the term of this patent is extended or adjusted under 35 U.S.C. 154(b) by 0 days.

(21) Appl. No.: 17/762,887

(22) PCT Filed: May 24, 2021

(86) PCT No.: PCT/CN2021/095515
§ 371 (c)(1),
(2) Date: Mar. 23, 2022

(87) PCT Pub. No.: WO2021/249169
PCT Pub. Date: Dec. 16, 2021

(65) Prior Publication Data
US 2022/0344904 A1    Oct. 27, 2022

(30) Foreign Application Priority Data

Jun. 9, 2020 (CN) .......................... 202010526713.7

(51) Int. Cl.
H01S 5/183    (2006.01)
H01S 5/028    (2006.01)
H01S 5/34     (2006.01)

(52) U.S. Cl.
CPC .......... *H01S 5/18397* (2013.01); *H01S 5/028* (2013.01); *H01S 5/3416* (2013.01)

(58) Field of Classification Search
CPC combination set(s) only.
See application file for complete search history.

(56) References Cited

U.S. PATENT DOCUMENTS 7,983,317 B2    7/2011    Bhat et al.
3,121,165 A1    2/2012    Bhat et al.
(Continued)

FOREIGN PATENT DOCUMENTS

CN    1588717 A    7/2004
CN    2738434 Y    11/2008
(Continued)

OTHER PUBLICATIONS

Foreign Communication from Related Application—First Chinese Office Action with English Translation dated Oct. 21, 2020, CN Patent Application No. 2020105267137 filed Jun. 9, 2020, 12 pages.
(Continued)

*Primary Examiner* — Tuan N Nguyen
(74) *Attorney, Agent, or Firm* — Conley Rose, P.C.; Rodney B. Carroll (57) ABSTRACT

The present application relates to the technical field of semiconductor optoelectronics, in particular to a multi-active-region cascaded semiconductor laser. The multi-active-region cascaded semiconductor laser comprises: a plurality of cascaded active regions, wherein each cascaded active region comprises a plurality of active regions; and a tunnel junction, arranged on at least one side of the cascaded (Continued)

active region and electrically connected with the cascaded active region; wherein in the cascaded active region, at least one group of adjacent active regions are connected through a barrier layer. In this way, more active regions are added in the periodic gain structure, which improves the internal quantum efficiency of the device and also reduces the carrier density, thereby obtaining more gains. The barrier layer connection does not have the property of introducing a new pn junction, so the layer will not increase the turn-on voltage for device operation, and meanwhile the epitaxial growth is much simpler than that of the tunnel junction.

9 Claims, 4 Drawing Sheets

(56) References Cited

U.S. PATENT DOCUMENTS

| | | | |
|---|---|---|---|
| 9,093,819 | B2 | 7/2015 | Fattal et al. |
| 9,948,060 | B2 | 4/2018 | Takiguchi et al. |
| 2004/0096996 | A1* | 5/2004 | Cheng ................ H01S 5/18305 438/22 |
| 2008/0093593 | A1 | 4/2008 | Ryu et al. |
| 2008/0298418 | A1* | 12/2008 | Uchida ............... H01S 5/04253 372/50.124 |
| 2010/0150193 | A1 | 6/2010 | Bhat et al. |
| 2012/0033699 | A1 | 2/2012 | Sekiguchi |
| 2015/0311673 | A1 | 10/2015 | Wang et al. |
| 2017/0338624 | A1 | 11/2017 | Takiguchi et al. |
| 2021/0391691 | A1 | 12/2021 | Sugiyama et al. |

FOREIGN PATENT DOCUMENTS

| | | |
|---|---|---|
| CN | 102246369 A | 11/2011 |
| CN | 102832538 A | 12/2012 |
| CN | 105977788 A | 3/2013 |
| CN | 105429004 A | 3/2016 |
| CN | 110959234 A | 4/2020 |
| CN | 111224320 A | 6/2020 |
| JP | 2001250251 A | 9/2001 |
| JP | 2012512546 A | 5/2012 |
| JP | 2013518430 A | 5/2013 |
| JP | 2016122711 A | 7/2016 |
| JP | 202068330 A | 4/2020 |
| WO | 2016104610 A1 | 6/2016 |
| WO | 2020076787 A2 | 4/2020 |

OTHER PUBLICATIONS

Foreign Communication from Related Application—Second Chinese Office Action with English Translation dated Nov. 19, 2020, CN Patent Application No. 2020105267137 filed Jun. 9, 2020, 12 pages.
Foreign Communication from Related Application—Third Chinese Office Action with English Translation dated Feb. 2, 2021, CN Patent Application No. 2020105267137 filed Jun. 9, 2020, 4 pages.
Foreign Communication from Related Application—International Search Report of the International Searching Authority, International Patent Application No. PCT/CN2021/095515 dated Jul. 29, 2021, 7 pages.
Foreign Communication from Related Application—European Extended Search Report, regarding Application No. EP 21822440.0-1212/4020725, dated Nov. 22, 2022, 8 pages.
Foreign Communication from Related Application—Notice of Reasons for Refusal, Japan Patent Office, Application No. 2022-519550, dated Feb. 1, 2023, 5 pages.

* cited by examiner

MULTI-ACTIVE-REGION CASCADED SEMICONDUCTOR LASER

CROSS REFERENCE OF RELATED APPLICATIONS

This application is a filing under 35 U.S.C. 371 of International Application No. PCT/CN2021/095515, filed May 24, 2021, entitled "MULTI-ACTIVE-REGION CASCADED SEMICONDUCTOR LASER," which claims priority to Chinese Patent Application No. 202010526713.7, filed Jun. 9, 2020, which applications are incorporated by reference herein in their entirety.

TECHNICAL FIELD

The present application relates to the technical field of semiconductor optoelectronics, in particular to a multi-active-region cascaded semiconductor laser.

BACKGROUND ART

A vertical-cavity surface-emitting laser is a semiconductor microcavity laser, compared with the traditional edge-emitting laser, owing to the advantages of low threshold current, small size, easy fiber coupling of circular symmetric spots, high beam quality, single longitudinal mode, easy integration of surface emission, the vertical-cavity surface-emitting laser has been developed rapidly in recent years, and has been widely used in such fields as face recognition and other three-dimensional sensing, optical communication, LIDAR and unmanned driving, etc.

Currently, the structure of a vertical-cavity surface-emitting laser includes: a resonator formed by an upper and a lower reflective surface, a gain region formed by stacking quantum well structures, and a current limiting layer (e.g., an oxide limiting layer, an ion injection limiting layer, etc.). The above vertical-cavity surface-emitting laser has a gain region formed by stacking a group of quantum wells. This type of vertical-cavity surface-emitting laser has a single point power of typically 10 mW (10 mA drive current) and an efficiency of generally close to 50%, and is mostly used in intelligent devices that require less power, and a 3D-structured light technology is used for face recognition at close range. However, for large 3D sensing application scenarios, such as in the field of LIDAR-based unmanned driving, the vertical-cavity surface-emitting laser of the above structure cannot satisfy requirements, and high-power and high-efficiency lasers are in need.

Based on such requirements, in the most widely available approach, this is achieved by increasing the number of active regions in the structure of a vertical-cavity surface-emitting laser, so as to form multiple gain regions to enhance the power and efficiency of the device. Generally, the quantum wells must be located at the wave peak of a periodic resonant structure to produce gains. Usually, after an external electric field drives a carrier to flow through the first active region, a sufficient number of quantum well stacks need to be designed, after the carrier is completely compounded, the carrier needs to be reactivated through a tunnel junction structure, so as to continue to compound the radiation photons in the next active region, and the active regions formed by stacking a plurality of quantum wells are connected through a tunnel junction, so as to further achieve higher power and efficiency. However, the tunnel junction is essentially a pn junction constituted by a very thin heavily-doped layer, and it is more difficult to achieve accurate heavy doping during epitaxial growth than the growth of other common epitaxial layers. The tunnel junction of the semiconductor cascaded active region is designed in the device structure in a reverse biased manner, and the introduction of the tunnel junction will increase the turn-on voltage for device operation, so as to increase the operating voltage. Meanwhile, as the demand for laser power and efficiency increases, and under the limitation of space and heat dissipation performance, it is increasingly difficult for the vertical-cavity surface-emitting laser with multiple active regions to satisfy the requirements for laser power and efficiency.

SUMMARY OF THE INVENTION

The main objective of the present application is to provide a multi-active-region cascaded semiconductor laser, to solve the problem of low efficiency of the multi-active-region cascaded semiconductor laser in the prior art.

To achieve the above objective, the present application provides a multi-active-region cascaded semiconductor laser, including: a plurality of cascaded active regions, wherein each cascaded active region includes a plurality of active regions; and a tunnel junction, arranged on at least one side of the cascaded active region and electrically connected with the cascaded active region; wherein in the cascaded active region, at least one group of adjacent active regions are connected through a barrier layer.

Further, in the cascaded active region, a plurality of groups of adjacent active regions are connected through a barrier layer.

Further, each active region is molded by stacking multiple quantum wells or by one quantum well; or each active region is molded by stacking multiple quantum wires or by one quantum wire; or each active region is molded by stacking multiple quantum dots or by one quantum dot.

Further, in the stacking of multiple quantum wells, the multiple quantum wells are connected through a tunnel junction and/or a barrier layer.

Further, multiple cascaded active regions are available, and two adjacent cascaded active regions are connected through the tunnel junction.

Further, the multi-active-region cascaded semiconductor laser further includes a current limiting layer, and the current limiting layer is arranged on the outer side of the active region.

Further, the number of the current limiting layer is one or multiple, and the current limiting layers are arranged in the upper region, the lower region or the middle region of the active region.

Further, the current limiting layer adopts an oxide layer containing aluminum and arsenic materials; or the current limiting layer adopts an ion implantation layer; or the current limiting layer adopts a high resistance layer.

Further, the multi-active-region cascaded semiconductor laser further includes an anti-reflective layer, and the anti-reflection layer is arranged at the light outlet of the semiconductor laser.

Further, the multi-active-region cascaded semiconductor laser further includes a grating layer, wherein the grating layer is arranged adjacent to the active region at an output end of the semiconductor laser.

Further, the multi-active-region cascaded semiconductor laser further includes a reflective layer, and the reflective layer includes an upper reflective layer and a lower reflective layer.

Further, the upper reflective layer and the lower reflective layer are one structure or a combination of any two of a distributed Bragg reflective structure, a sub-wavelength grating structure, a metal film reflective structure, and a dielectric film reflective structure.

Further, the reflective layer is molded by stacking materials of high and low refractive indexes, or by stacking materials of high and low refractive indexes and forming a gradient layer between materials of high and low refractive indexes.

Further, the multi-active-region cascaded semiconductor laser is a multi-active-region vertical surface emitting laser.

The technical solutions of the present application have the following advantages:

In the multi-active-region cascaded semiconductor laser provided in the present application, the individual small number of quantum well stacks are periodically distributed in the center of each peak of the periodic optical field, in this way, each group of quantum well stacks occupies the position closer to the peak of the optical field, thereby increasing the intracavity gain, reducing the threshold of the device, and increasing no internal loss of the material, and further increasing the power and efficiency of the laser. The two adjacent active regions are connected by a barrier layer, which allows the carrier to be fully compounded, and then the tunnel junction structure is added, such that the carrier is reactivated and continues to flow into the next cascaded active region to produce gains, then the carrier can continue to compound in the next active region to generate photons, so that more active regions are added in the periodic gain structure, which improves the internal quantum efficiency of the device and also reduces the carrier density, thereby obtaining more gains. The barrier layer connection does not have the property of introducing a new pn junction, so the layer will not increase the turn-on voltage for device operation, and meanwhile the epitaxial growth is much simpler than that of the tunnel junction.

BRIEF DESCRIPTION OF THE DRAWINGS

To more clearly illustrate the technical solutions in specific embodiments of the present application or in the prior art, the accompanying drawings which need to be used in the description of the specific implementation or the prior art will be briefly introduced below. Obviously, the accompanying drawings in the following description are some embodiments of the present application, and other drawings may be obtained from these drawings by those skilled in the art without any creative effort. In the drawings.

Wherein the reference numerals in the above drawings are as follows:

1, first electrode; 2, substrate; 3, lower reflective layer; 4, gain region; 5, first waveguide layer; 6, first active region; 7, first barrier layer; 8, second active region; 9, second waveguide layer; 10, tunnel junction; 11, third waveguide layer; 12, third active region; 13, second barrier layer; 14, fourth active region; 15, fourth waveguide layer; 16, current limiting layer; 17, upper reflective layer; 18, anti-reflective layer; 19, second electrode; 20, grating layer; 201, high refractive index material layer; 203, low refractive index material layer; 202, first high and low refractive index material layer transition layer; 204, second high and low refractive index material layer transition layer.

DETAILED DESCRIPTION OF THE EMBODIMENTS

The technical solutions of the present application will be clearly and completely described below in combination with the accompanying drawings, and obviously, the described embodiments are a part but not all of the embodiments of the present application. Based on the embodiments in the present application, all the other embodiments obtained by those skilled in the art without any creative effort shall all fall within the protection scope of the present application.

In the description of the present application, it should be noted that, the orientation or positional relationship indicated by such terms as "center", "up", "down", "left", "right", "vertical", "horizontal", "inner" and "outer" is the orientation or positional relationship based on the accompanying drawings. Such terms are merely for the convenience of description of the present application and simplified description, rather than indicating or implying that the device or element referred to must be located in a certain orientation or must be constructed or operated in a certain orientation, therefore, the terms cannot be understood as a limitation to the present application. In addition, the terms "first", "second" and "third" are merely for descriptive purpose, rather than indicating or implying relative importance.

As shown in FIG. 1 to FIG. 6, the multi-active-region cascaded semiconductor laser in the present embodiment includes: a plurality of cascaded active regions, wherein each cascaded active region includes a plurality of active regions; and a tunnel junction 10, arranged in at least one side of the cascaded active region and electrically connected with the cascaded active region; wherein in the cascaded active region, at least one group of adjacent active regions are connected through a barrier layer.

Further, in the multi-active-region cascaded semiconductor laser in the present embodiment, two adjacent active regions are connected by a barrier layer, then after the carrier is completely compounded, a tunnel junction 10 structure is added to reactivate the carrier, the carrier continues to flow into the next cascaded active region to produce gains, then the carrier can continue to compound in the next active region to generate photons, so that more active regions are added in the periodic gain structure, which improves the internal quantum efficiency of the device and also reduces the carrier density, thereby obtaining more gains. In the whole process, when the gain is achieved, since the application of the tunnel junction 10 is reduced, while the tunnel junction 10 has a pn junction property, the turn-on voltage for device operation will be increased, thereby improving the operating voltage. For the barrier layer connection, no new pn junction is introduced, so the turn-on voltage will not be increased, then the epitaxial growth is much simpler than that of the tunnel junction 10, therefore, the spatial position of the laser cavity is more sufficiently used to achieve greater gains, such that the multi-active-region cascaded semiconductor laser may provide higher power and efficiency.

It should be noted that, the active region in the present embodiment is that the quantum structure can produce gains at the wave peak position of the vertical-cavity laser mode field, the cascaded active region is the combination of two and more active regions, the cascaded active region in the present embodiment may be, but not limited to two, three, four or more.

The gain region 4 in the present embodiment can be a quantum well structure, a quantum wire, or a quantum dot structure. Specifically, in the present embodiment, each active region is molded by stacking multiple quantum wells or by one quantum well; or each active region is molded by stacking multiple quantum wires or by one quantum wire; or each active region is molded by stacking multiple quantum dots or by one quantum dot. With the active region adopting a quantum well structure as an example, in the design, the center of the quantum well is located at the peak of the near-field distribution, and two active regions form a cascaded active region, and the tunnel junction 10 is arranged between the two cascaded active regions.

For the principles of the present application, it should be further noted that, the current quantum wells are generally located at the peak position of the optical field, to enable the quantum wells to produce greater gains, and the active region of the previous structure has only one group of quantum well stacks, and generally more quantum well stacks should be designed, so that the carrier is fully compounded, then the carrier is reactivated through the tunnel junction 10, and then the carrier enters the quantum well stack of the next active region for continuous compounding. However, each quantum well in a group of quantum well stacks has a different overlap ratio with the optical field. The middlemost quantum well is at the peak and the side quantum well is at the lower position of the optical field intensity. In this way, even if the number of quantum wells is continuously increased, the provided gains are limited since the side quantum wells are arranged in lower optical field position.

In the multi-active-region cascaded semiconductor laser provided in the embodiment of the present application, the individual small number of quantum well stacks are periodically distributed in the center of each peak of the periodic optical field, in this way, each group of quantum well stacks occupies the position closer to the peak of the optical field, thereby increasing the intracavity gain, reducing the threshold of the device, and increasing no internal loss of the material, and further increasing the power and efficiency of the laser. The two adjacent active regions are connected by a barrier layer, which allows the carrier to be fully compounded, and then the tunnel junction 10 structure is added, such that the carrier is reactivated and continues to flow into the next cascaded active region to produce gains, then the carrier can continue to compound in the next active region to generate photons, so that more active regions are added in the periodic gain structure, which improves the internal quantum efficiency of the device and also reduces the carrier density, thereby obtaining more gains. The barrier layer connection does not have the property of introducing a new pn junction, so the layer will not increase the turn-on voltage for device operation, and meanwhile the epitaxial growth is much simpler than that of the tunnel junction 10.

The multi-active-region cascaded semiconductor laser in the present embodiment is specifically a multi-active-region vertical-cavity surface-emitting laser. Please further refer to FIG. 1 and FIG. 3, with the gain region 4 of the emitting layer including two cascaded active regions as an example, one of the cascaded active region includes a first active region 6 and a second active region 8, the other cascaded active region includes a third active region 12 and a fourth active region 14, and the two cascaded active regions are connected through a tunnel junction 10. Wherein the first active region 6 is connected with the second active region 8 through the first barrier layer 7, and the second active region 8 is connected with the tunnel junction 10 through the second waveguide layer 9. The third active region 12 is connected with the tunnel junction 10 through the third waveguide layer 11, and the third active region 12 is connected with the fourth active region 14 through the second barrier layer 13.

Figure 1:
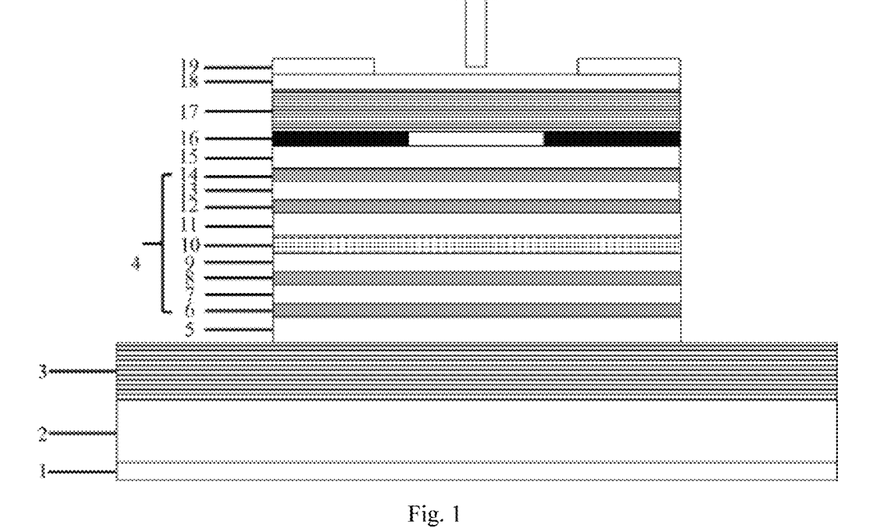
FIG. 1 is a schematic diagram of a main view of a multi-active-region cascaded semiconductor laser in the embodiment of the present application.

Please further refer to FIG. 1, on one side of the gain region 4, the semiconductor laser of the present embodiment further includes a first electrode 1, a substrate 2 matching with the electrode, an upper reflective layer 17 and a lower reflective layer 3 arranged on the substrate 2, and a first waveguide layer 5 arranged on the upper reflective layer 17 and the lower reflective layer 3, and the first waveguide layer 5 is matched with the gain region 4. On the other side of the gain region 4, a second electrode 19, an anti-reflective layer 18, an upper reflective layer 17, a current limiting layer 16, and a fourth waveguide layer 15 are further included, and the fourth waveguide layer 15 is matched with the gain region 4.

Figure 3:
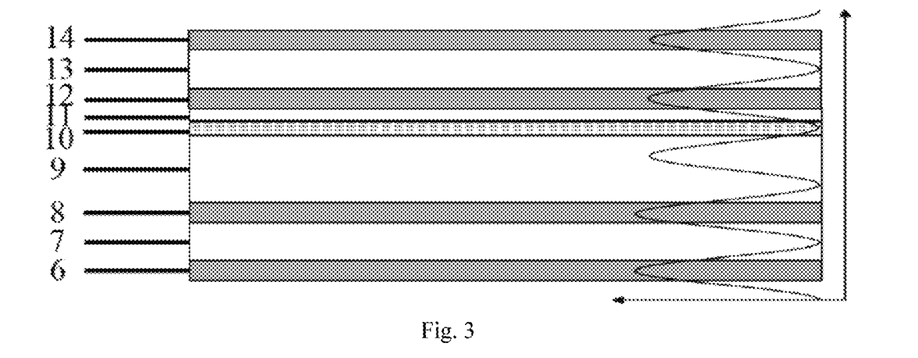
FIG. 3 is a structural schematic diagram of a gain region in a multi-active-region cascaded semiconductor laser as shown in FIG. 1, illustrating the optical field distribution of the gain region.

Please further refer to FIG. 3, preferably, in the cascaded active region in the present embodiment, a plurality of adjacent active regions are connected through a barrier layer, while ensuring that the vertical-cavity surface-emitting laser of the multiple active regions can operate stably, the use of the tunnel junction 10 is reduced possibly, further the multi-active-region cascaded semiconductor laser may provide higher power and efficiency.

Specifically, each active region is molded by stacking multiple quantum wells or by one quantum well. In multiple quantum well stacks, multiple quantum wells are connected through a barrier layer. Of course, multiple quantum wells can also be connected through a tunnel junction 10, or the tunnel junction 10 and the barrier layer are connected alternatively.

Specifically, the current limiting layer 16 in the present embodiment is arranged on the outer side of the gain region 4, and is positioned close to the gain region 4, either above the gain region 4 or below the gain region 4, or a combination of the two. Wherein, the number of the current limiting layers 16 is one or more. The current limiting layer 16 is formed by using an oxide layer containing aluminum and arsenic materials, such as aluminum gallium-arsenic, aluminum cadmium-arsenic, and aluminum arsenic, thereby making the semiconductor laser have a good current limiting effect. Of course, the current limiting layer 16 in the present embodiment can also adopt an ion injection layer, and a high-resistance layer is adopted.

Specifically, the semiconductor laser in the present embodiment further includes an anti-reflective layer 18, and the anti-reflective layer 18 is arranged at a light outlet of the semiconductor laser.

Figure 4:
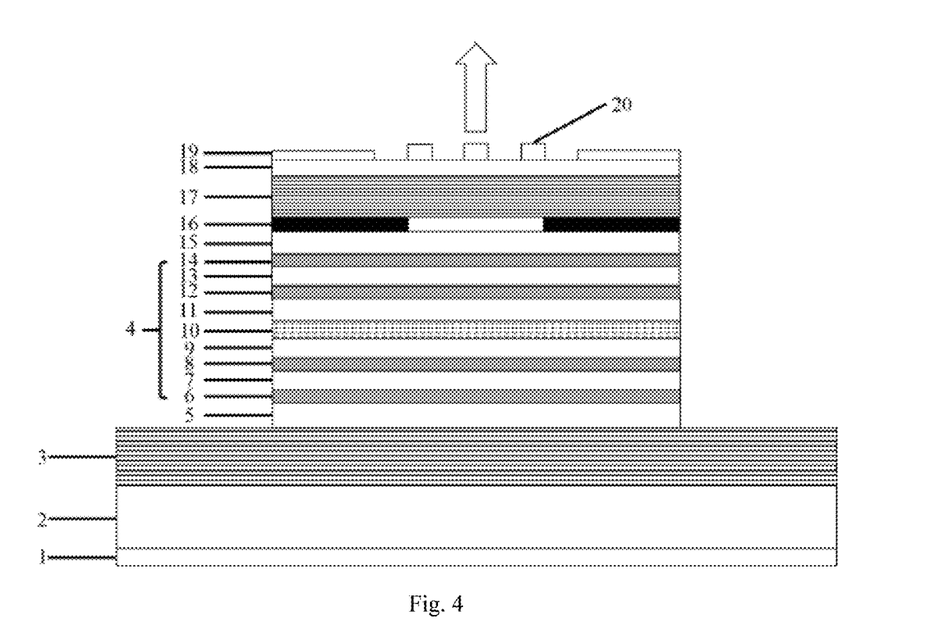
FIG. 4 is a structural schematic diagram achieving polarization input through adding surface grating to the multi-active-region cascaded semiconductor laser as shown in FIG. 1.

Please further refer to FIG. 4, specifically, the multi-active-region cascaded semiconductor laser in the present embodiment further includes a grating layer 20, and the grating layer 20 is arranged adjacent to the active region at an output end of the semiconductor laser, and further output of polarized light may be achieved.

Figure 2:
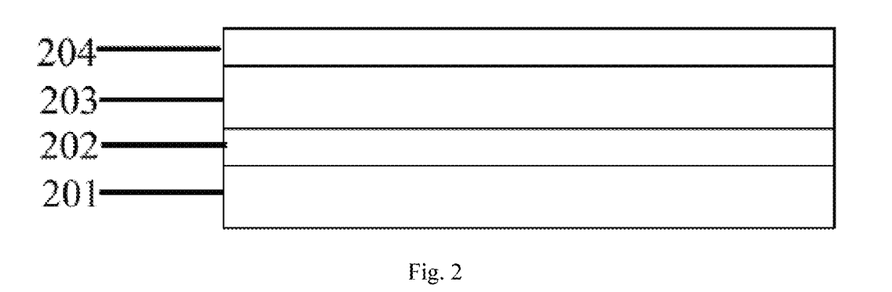
FIG. 2 is a schematic diagram of a main view of a reflective layer in a multi-active-region cascaded semiconductor laser as shown in FIG. 1.

Please further refer to FIG. 2, specifically, the reflective layer in the multi-active-region cascaded semiconductor laser further includes an upper reflective layer 17 and a lower reflective layer 3, the upper reflective layer 17 and the lower reflective layer 3 in the present embodiment are one structure or a combination of any two of a distributed Bragg reflective structure, a sub-wavelength grating structure, a metal film reflective structure, and a dielectric film reflective structure. For example, the upper reflective layer 17 and the lower reflective layer 3 in the present embodiment can be both of a distributed Bragg reflective structure. Or the upper reflective layer 17 is of a distributed Bragg reflective structure, the lower reflective layer 3 is of a sub-wavelength grating structure, which is not enumerated herein.

The reflective layer in the present embodiment is molded by stacking the high refractive index material layer 201 and the low refractive index material layer 203. Alternatively, the reflective layer is alternately molded by stacking the high refractive index material layer 201 and the low refractive index material layer 203, and by arranging a first high and low refractive index material layer transition layer 202 and a second high and low refractive index material layer transition layer 204 between the high and low refractive index materials of the high refractive index material layer 201 and the low refractive index material layer 203.

Figure 5:
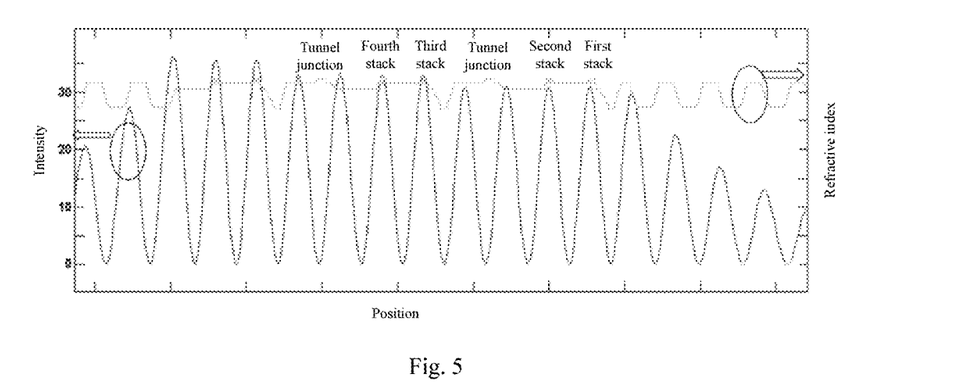
FIG. 5 is a periodic resonant standing wave field diagram in the gain region shown in FIG. 3.

Pleaser further refer to FIG. 5 which illustrates a gain region 4 standing wave field diagram with six cascaded active regions, in the figure, each quantum well stacking layer is arranged at the peak position of the periodic resonant optical field to form an active region, such that the composite carriers in the quantum well stacking layer can not only be completely compounded but also be compounded at the peak of the optical field, to produce greater gains. In the present embodiment, two groups of quantum well stacking layers are designed, that is, two cascaded active regions, each group of stacking layers contains multiple quantum wells and the quantum wells are connected through barrier layers. After these two groups of quantum well stacking layers are compounded, tunnel junctions 10 are used to reactivate the carrier and the carrier continues to flow into the third and fourth quantum well stacks for compounding, thereby increasing the internal quantum efficiency of the device and also reducing the carrier density, and further resulting in more gains. The barrier layer connection does not have the property of introducing a new pn junction, so the layer will not increase the turn-on voltage for device operation, and meanwhile the epitaxial growth is much simpler than that of the tunnel junction 10.

Figure 6:
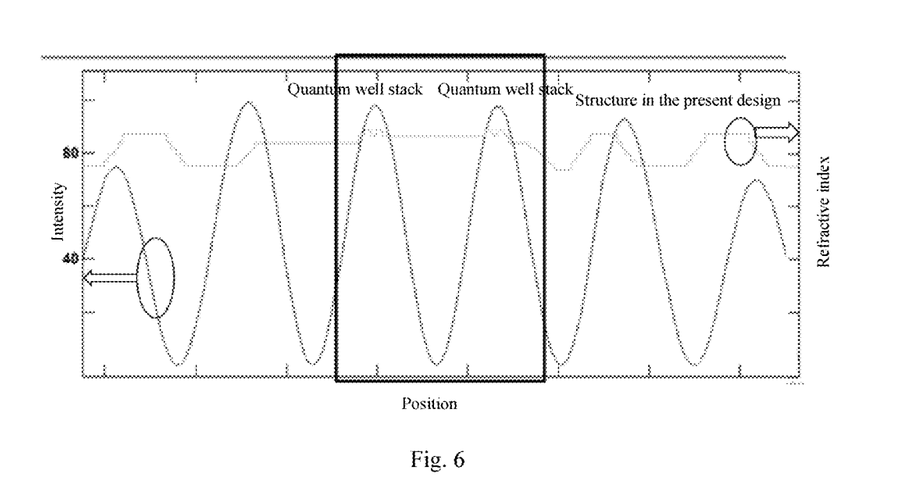
FIG. 6 is a periodic resonant standing wave field diagram of stacking of quantum wells in the embodiment of the present application.
Figure 7:
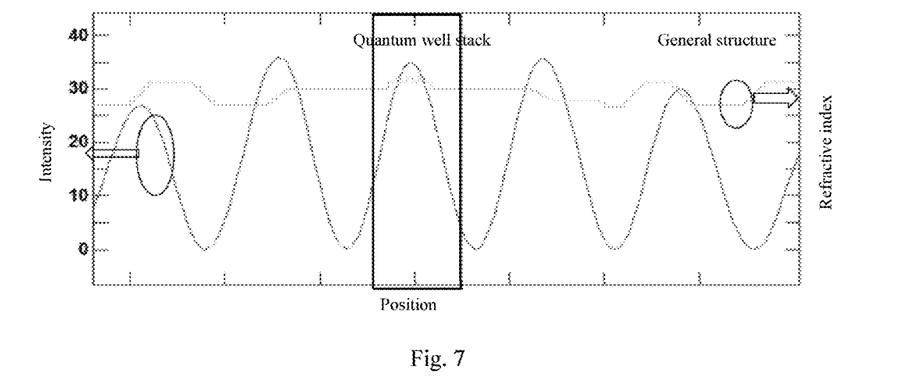
FIG. 7 is a periodic resonant standing wave field diagram of stacking of the existing quantum wells.

FIG. 7 shows an enlarged view of a standing wave field of a quantum well stacking layer of an active region in our design generally, herein, it can be seen obviously that many quantum wells are stacked together and placed at a standing wave peak to allow the carrier to be completely compounded, and it can be seen that the position of the edge quantum wells is far away from the wave peak position of the standing wave field. As shown in FIG. 6, a small number of quantum well stacks are used in the present embodiment, the quantum well stacks are distributed at multiple wave peak positions, such that while the carrier can also be completely compounded, each group of quantum well stacks are close to the wave peak position, and the generated gain effect is greater.

Figure 8:
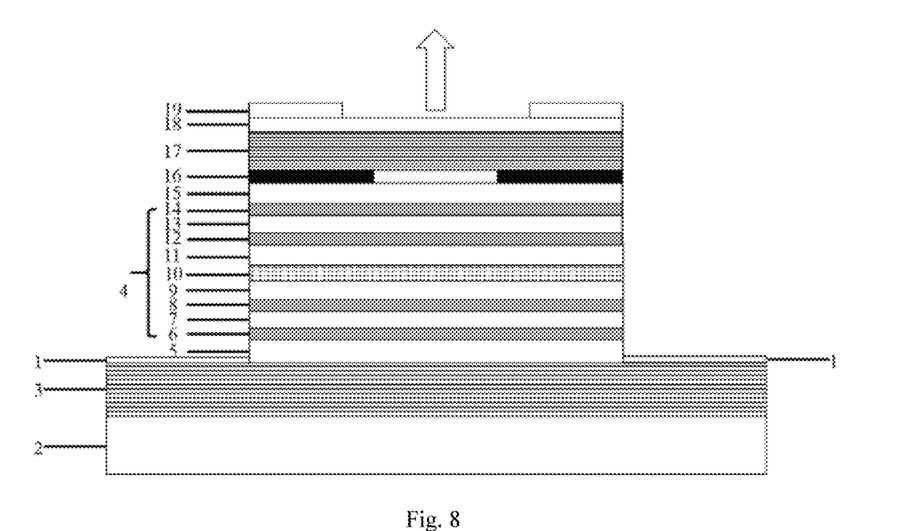
FIG. 8 is a structural diagram of a multi-active-region cascaded semiconductor laser in a deformation embodiment of the present application.

FIG. 8 is a structural diagram of a semiconductor laser with multiple cascaded active regions in the deformation embodiment of the present application. Compared with the above embodiment, the difference lies in that the first electrode 1 is arranged above the lower reflective layer 3, the present embodiment also possesses the advantages of the above embodiment and also can achieve the objective of the present application.

Figure 9:
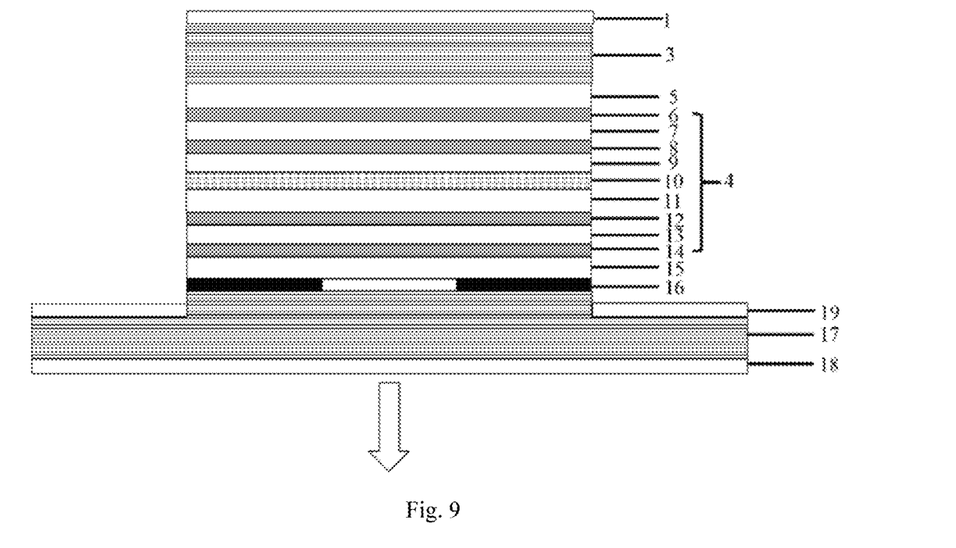
FIG. 9 is a structural diagram of a multi-active-region cascaded semiconductor laser in another deformation embodiment of the present application, wherein the semiconductor laser is a bottom-emitting semiconductor laser.

FIG. 9 is a structural diagram of a semiconductor laser with multiple cascaded active regions in another deformation embodiment of the present application. Compared with the above embodiment, the semiconductor laser in the present embodiment is a bottom-emitting semiconductor laser, the present embodiment also possesses the advantages of the above embodiment and also can achieve the objective of the present application.

Obviously, the foregoing embodiments are merely examples for clear description, and are not intended to limit the implementations. For those of ordinary skills in the art, other changes or modifications in different forms can be made on the basis of the above description. It is unnecessary and impossible to enumerate all the implementations herein. The obvious changes or variations derived from this shall still fall within the protection scope of the present application.

The invention claimed is:

1. An electroluminescent multi-active-region cascaded semiconductor laser, comprising:
   a plurality of cascaded active regions, wherein each cascaded active region comprises a plurality of active regions;
   an anti-reflective layer, and the anti-reflection layer is arranged at the light outlet of the semiconductor laser;
   a grating layer, wherein the grating layer is arranged adjacent to the active region at an output end of the semiconductor laser;
   a current limiting layer, and the current limiting layer is arranged on the outer side of the active region;
   a reflective layer, and the reflective layer comprises an upper reflective layer and a lower reflective layer; and
   a tunnel junction, arranged on at least one side of the cascaded active region and electrically connected with the cascaded active region;
   wherein in the cascaded active region, each group of adjacent active regions are connected through a barrier layer,
   after each cascaded active region relies on multiple active regions to allow the carrier to be fully compounded, the compounded carrier in the last cascaded active region is added into the tunnel junction structure such that the carrier is activated, and then enter the next cascaded active region.

2. The electroluminescent multi-active-region cascaded semiconductor laser according to claim 1, wherein each active region is molded by stacking multiple quantum wells or by one quantum well; or each active region is molded by stacking multiple quantum wires or by one quantum wire; or each active region is molded by stacking multiple quantum dots or by one quantum dot.

3. The electroluminescent multi-active-region cascaded semiconductor laser according to claim 2, wherein in the stacking of multiple quantum wells, the multiple quantum wells are connected through a tunnel junction and/or a barrier layer.

4. The electroluminescent multi-active-region cascaded semiconductor laser according to claim 1, wherein multiple cascaded active regions are available, and two adjacent cascaded active regions are connected through the tunnel junction.

5. The electroluminescent multi-active-region cascaded semiconductor laser according to claim 1, wherein the number of the current limiting layer is one or multiple, and the current limiting layers are arranged in the upper region, the lower region or the middle region of the active region.

6. The electroluminescent multi-active-region cascaded semiconductor laser according to claim 1, wherein the current limiting layer adopts an oxide layer containing aluminum and arsenic materials; or the current limiting layer adopts an ion implantation layer; or the current limiting layer adopts a high resistance layer.

7. The electroluminescent multi-active-region cascaded semiconductor laser according to claim 1, wherein the upper reflective layer and the lower reflective layer are one structure or a combination of any two of a distributed Bragg reflective structure, a sub-wavelength grating structure, a metal film reflective structure, and a dielectric film reflective structure.

8. The electroluminescent multi-active-region cascaded semiconductor laser according to claim 1, wherein the reflective layer is molded by stacking materials of high and low refractive indexes, or by stacking materials of high and low refractive indexes and forming a gradient layer between materials of high and low refractive indexes.

9. The electroluminescent multi-active-region cascaded semiconductor laser according to claim 1, wherein the multi-active-region cascaded semiconductor laser is a multi-active-region vertical surface emitting laser.

* * * * *